United States Patent
Katayama et al.

(10) Patent No.: US 9,695,283 B2
(45) Date of Patent: *Jul. 4, 2017

(54) DISPLAY DEVICE, METHOD FOR MANUFACTURING SAME, POLYIMIDE FILM FOR DISPLAY DEVICE SUPPORTING BASES, AND METHOD FOR PRODUCING POLYIMIDE FILM FOR DISPLAY DEVICE SUPPORTING BASES

(71) Applicant: NIPPON STEEL & SUMIKIN CHEMICAL CO., LTD., Tokyo (JP)

(72) Inventors: Masakazu Katayama, Tokyo (JP); Katsufumi Hiraishi, Tokyo (JP); Yoshiki Suto, Kisarazu (JP); Natsuko Okazaki, Tokyo (JP); Hongyuan Wang, Kisarazu (JP)

(73) Assignee: NIPPON STEEL & SUMIKIN CHEMICAL CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/145,734

(22) Filed: May 3, 2016

(65) Prior Publication Data
US 2016/0244565 A1    Aug. 25, 2016

Related U.S. Application Data

(63) Continuation of application No. 14/409,847, filed as application No. PCT/JP2013/066745 on Jun. 18, 2013, now Pat. No. 9,403,947.

(30) Foreign Application Priority Data

Jun. 19, 2012  (JP) ................................. 2012-138110
Jun. 19, 2012  (JP) ................................. 2012-138140

(51) Int. Cl.
C08G 73/10        (2006.01)
C08J 5/18         (2006.01)
(Continued)

(52) U.S. Cl.
CPC ........ C08G 73/1067 (2013.01); B32B 27/281 (2013.01); C08G 73/1039 (2013.01);
(Continued)

(58) Field of Classification Search
CPC ............ C08G 73/1067; C08G 73/1042; C08G 73/1039; H01L 51/0043; H01L 51/0035;
(Continued)

(56) References Cited

U.S. PATENT DOCUMENTS 5,108,201 A  4/1992  Matsuura et al.
7,202,504 B2  4/2007  Ikeda et al.
(Continued)

FOREIGN PATENT DOCUMENTS

JP  2-251564 A   10/1990
JP  3-246515 A   11/1991
(Continued)

OTHER PUBLICATIONS

An, Sungguk et al., "2.8-inch WQVGA Flexible AMOLED Using High Performance Low Temperature Polysilicon TFT on Plastic Substrates", SID 10 Digest, 2010, pp. 706-709.
(Continued)

*Primary Examiner* — William Coleman
(74) *Attorney, Agent, or Firm* — Cheng Law Group, PLLC (57) ABSTRACT

Provided is a display device that can be made thin, lightweight, and flexible, has no problems of cracks and peeling caused by thermal stress, and is excellent in dimension stability and the like. The display device includes: a supporting base including a polyimide film; and a gas barrier
(Continued)

layer formed on the supporting base, in which the polyimide film has a transmittance of 80% or more in a wavelength region of from 440 nm to 780 nm, and a coefficient of thermal expansion of 15 ppm/K or less, and has a difference in coefficient of thermal expansion from the gas barrier layer of 10 ppm/K or less.

6 Claims, 1 Drawing Sheet (51) Int. Cl.
| | |
|---|---|
| *H01L 51/00* | (2006.01) |
| *H01L 51/52* | (2006.01) |
| *C09D 179/08* | (2006.01) |
| *H05B 33/04* | (2006.01) |
| *B32B 27/28* | (2006.01) |
| *H01L 27/32* | (2006.01) |
| *H01L 51/56* | (2006.01) |
| *G02B 5/20* | (2006.01) |
| *G02F 1/167* | (2006.01) |

(52) U.S. Cl.
CPC ............ *C08G 73/1042* (2013.01); *C08J 5/18* (2013.01); *C09D 179/08* (2013.01); *G02B 5/20* (2013.01); *G02F 1/167* (2013.01); *H01L 27/322* (2013.01); *H01L 51/0035* (2013.01); *H01L 51/0043* (2013.01); *H01L 51/0097* (2013.01); *H01L 51/5253* (2013.01); *H01L 51/56* (2013.01); *H05B 33/04* (2013.01); *C08J 2379/08* (2013.01); *H01L 2251/301* (2013.01); *H01L 2251/303* (2013.01); *H01L 2251/5307* (2013.01); *H01L 2251/5315* (2013.01); *H01L 2251/5338* (2013.01); *H01L 2251/558* (2013.01); *Y02E 10/549* (2013.01); *Y02P 70/521* (2015.11); *Y10T 428/24355* (2015.01); *Y10T 428/31721* (2015.04)

(58) Field of Classification Search
CPC ... H01L 51/56; H01L 27/322; H01L 51/5253; H01L 51/0097; G02F 1/167; G02B 5/20; B32B 27/281; H05B 33/04; C09D 179/08; C08J 5/18
See application file for complete search history.

(56) References Cited

U.S. PATENT DOCUMENTS

| | | | |
|---|---|---|---|
| 7,872,716 B2 | 1/2011 | Nagai | |
| 8,257,901 B2 | 9/2012 | Kim et al. | |
| 8,722,842 B2 | 5/2014 | Iida et al. | |
| 9,403,947 B2* | 8/2016 | Katayama | .................. C08J 5/18 |
| 2003/0032210 A1 | 2/2003 | Takayama et al. | |
| 2007/0241665 A1 | 10/2007 | Sakanoue et al. | |
| 2008/0075922 A1 | 3/2008 | Ueda | |
| 2008/0138537 A1 | 6/2008 | Simone et al. | |
| 2008/0176041 A1 | 7/2008 | Sato et al. | |
| 2011/0260180 A1 | 10/2011 | Kuranaga et al. | |
| 2014/0037930 A1 | 2/2014 | Sun et al. | |

FOREIGN PATENT DOCUMENTS

| | | |
|---|---|---|
| JP | 4-8733 A | 1/1992 |
| JP | 4-47933 A | 2/1992 |
| JP | 4-328524 A | 11/1992 |
| JP | 2003-260750 A | 9/2003 |
| JP | 2006-255918 A | 9/2006 |
| JP | 2007-86771 A | 4/2007 |
| JP | 2007-298732 A | 11/2007 |
| JP | 2008-231327 A | 10/2008 |
| JP | 2008-256736 A | 10/2008 |
| JP | 2010-100674 A | 5/2010 |
| JP | 2011-31429 A | 2/2011 |
| JP | 2011-238355 A | 11/2011 |
| JP | 2012-000546 A | 1/2012 |
| JP | 2012-102155 A | 5/2012 |

OTHER PUBLICATIONS

Oishi, Jitsuo et al., "Transparent PI for flexible display", IDW '11 FLX2surasshuFMC4-1, pp. 1277-1279.

International Search Report for Application No. PCT/JP2013/066745 mailed Sep. 10, 2013.

English Translation of International Preliminary Report on Patentability (PCT/IPEA/409) for the Application No. PCT/JP2013/066745 mailed Dec. 24, 2014.

* cited by examiner

FIG. 1

FIG. 2

DISPLAY DEVICE, METHOD FOR MANUFACTURING SAME, POLYIMIDE FILM FOR DISPLAY DEVICE SUPPORTING BASES, AND METHOD FOR PRODUCING POLYIMIDE FILM FOR DISPLAY DEVICE SUPPORTING BASES

CROSS-REFERENCE TO RELATED APPLICATIONS

This application is a Continuation Application of patent application Ser. No. 14/409,847, filed on Dec. 19, 2014, which is a 371 application of Application No. PCT/JP2013/066745, filed on Jun. 18, 2013, which is based on Japanese Application Nos. 2012-138110 and 2012-138140 filed on Jun. 19, 2012, the entire contents of which are hereby incorporated by reference.

TECHNICAL FIELD

The present invention relates to a display device and a manufacturing method therefor, and to a polyimide film for a display device supporting base and a production method therefor. More specifically, the present invention relates to a display device including a supporting base including a polyimide film and a gas barrier layer formed on the supporting base and a manufacturing method therefor, and to a polyimide film for a display device supporting base and a production method therefor.

BACKGROUND ART

An organic EL device to be used for various displays, for example, large-size displays such as a television and small-size displays such as a mobile phone, a personal computer, and a smartphone is generally manufactured by forming thin film transistors (hereinafter referred to as "TFTs") on a glass substrate serving as a supporting base, successively forming an electrode, a light-emitting layer, and an electrode on the glass substrate having the TFTs formed thereon, and finally hermetically sealing the resultant with a separate glass substrate, multi-layered thin film, or the like. As structures of the organic EL device, there are given a bottom-emission structure in which light is extracted from the side of a glass substrate serving as a supporting base and a top-emission structure in which light is extracted from the side opposite to a glass substrate serving as a supporting base, and those structures are used properly depending on the applications. As another structure of the organic EL device, there may be adopted a structure that allows outside light to directly pass therethrough, and hence there has also been proposed a transparent structure in which electronic elements such as TFTs are visible from the outside. All of the above-mentioned structures can be realized by selecting transparent electrodes and substrate materials.

In addition, the organic EL device can be made thin, lightweight, and flexible by substituting a resin for the related-art glass substrate as the supporting base of the organic EL device. As a result, the applications of the organic EL device can further expanded. However, the resin is generally inferior to glass in dimension stability, transparency, heat resistance, moisture resistance, gas barrier property, and the like, and hence various studies of the resin have been conducted.

For example, JP 2008-231327 A (Patent Literature 1) relates to the invention of a polyimide and a precursor thereof useful as a plastic substrate for a flexible display and has reported that polyimides obtained by subjecting tetracarboxylic acids containing an alicyclic structure such as cyclohexylphenyl tetracarboxylic acid to reactions with various diamines are excellent in transparency. However, there is a problem in that the polyimides obtained in the foregoing have a glass transition temperature of up to 337° C. according to Examples (Table 1), and hence cannot withstand a heat treatment temperature generally reaching about 400° C. during the annealing step of TFTs. In addition, all of the obtained polyimides have a coefficient of thermal expansion (CTE) of from about 50 ppm/K to about 60 ppm/K. Therefore, in the case where a gas barrier layer is formed so as to impart gas barrier property to the polyimide as in Patent Literature 2 described later, peeling and cracks occur at an interface between the gas barrier layer and the polyimide, with the result that it is difficult to obtain an organic EL device excellent in shape stability.

Further, JP 2011-238355 A (Patent Literature 2) relates to the invention of a gas barrier film that is excellent in gas barrier property and heat resistance, is flexible, and can be used as a base for an organic EL device or the like, and discloses the following: a flexible film made of polyethylene terephthalate (PET), polyethylene naphthalate (PEN), polycarbonate (PC), polyvinyl chloride (PVC), polyimide, or the like is used as a base; a stress relaxation layer and a gas barrier layer (inorganic barrier layer) including a compound containing at least silicon and oxygen are formed on one surface side of the flexible film so as to prevent the permeation of water vapor and air; and the coefficient of thermal expansion of the stress relaxation layer is set within a range of from 0.5 ppm/K to 20 ppm/K so as to prevent the occurrence of peeling and cracks caused by differences in thermophysical properties (coefficient of thermal expansion, thermal shrinkage rate) between the resin base and the inorganic barrier layer. However, there is a problem in that the flexible film made of PET, PEN, PC, PCV, or the like given as the supporting base in the foregoing does not have sufficient heat resistance and hence cannot withstand the heat treatment temperature generally reaching about 400° C. during the annealing step of TFTs. Further, polyimide (gas barrier film 2-3) used in Comparative Example has a transmittance lower than that of glass due to a yellowish brown color thereof and hence is not preferred as a resin to be substituted for glass.

Further, JP 2007-46054 A (Patent Literature 3) relates to the invention of a low tinted polyimide resin composition useful for glass type applications in the field of electronic displays, and discloses that a polyimide film containing a perfluoro-imide moiety has a low coefficient of thermal expansion and a high glass transition temperature and is excellent in transparency. However, the transmittance in a visible light region of most of the polyimide films actually obtained in Examples has not reached 80%, and the glass transition temperature thereof has not reached 400° C. Thus, a polyimide film that concurrently satisfies low thermal expandability, transparency, and heat resistance has not been obtained.

Similarly, JP 2-251564 A (Patent Literature 4) discloses that a fluorine-containing polyimide composition containing a fluorinated alkyl group introduced into an acid anhydride and a diamine has a low dielectric constant, a low water absorption coefficient, and low thermal expandability and is applicable to materials for printed boards and optical waveguides. However, Patent Literature 4 does not describe the transmittance in a visible light region of a polyimide film. Further, Patent Literature 4 does not describe means for solving the retardation problem caused when a transparent polyimide film having a low coefficient of thermal expansion is applied to a supporting base of a display device.

Besides the above, attempts have been made to reduce the weight of a device by using a flexible resin for a supporting base. For example, Non Patent Literatures 1 and 2 listed below have proposed organic EL devices in which polyimide having high transparency is applied to the supporting base. However, as described above, it cannot be said that the difference in coefficient of thermal expansion between the polyimide films described in those literatures and the gas barrier layer of an inorganic compound formed so as to compensate for gas barrier property is sufficiently small.

CITATION LIST

Patent Literature

[PTL 1] JP 2008-231327 A
[PTL 2] JP 2011-238355 A
[PTL 3] JP 2007-46054 A
[PTL 4] JP 2-251564 A

Non Patent Literature

[NPL 1] S. An et. Al., "2.8-inch WQVGA Flexible AMOLED Using High Performance Low Temperature Polysilicon TFT on Plastic Substrates", SID 10 DIGEST, p 706 (2010)
[NPL 2] Oishi et. Al., "Transparent PI for flexible display", IDW '11 FLX2surasshuFMC4-1

SUMMARY OF INVENTION

Technical Problem

As described above, the organic EL device has low resistance to water, and the characteristics of an EL element serving as a light-emitting layer are degraded due to water. Therefore, in the case where a resin is used for the supporting base, it is necessary to form a gas barrier layer on at least one surface of the supporting base so as to prevent the entry of water and oxygen into the organic EL device. In general, as a gas barrier layer excellent in gas barrier performance, inorganic materials typified by silicon oxide and silicon nitride have bean used, and those materials generally have a coefficient of thermal expansion (CTE) of from 0 ppm/K to 10 ppm/K. In contrast, transparent polyimide generally has a CTE of about 60 ppm/K. Therefore, when an attempt is made to simply apply the transparent polyimide to the supporting base of the organic EL device, for example, there arises a problem in that cracks and peeling occur in the gas barrier layer due to the thermal stress.

Further, the annealing step during which the temperature reaches about 400° C. is required for forming TFTs necessary for the display application. Although there is no particular problem in introducing the annealing step in the case of using a related-art glass substrate, when a resin is used for the supporting base, it is necessary that the resin have heat resistance and dimension stability at the heat treatment temperature of the TFT. On the other hand, there is a case in which the TFTs are not required as in an organic EL device for illumination. However, the power consumption of the organic EL device can be reduced by increasing the film formation temperature of a transparent electrode adjacent to the supporting base to lower the resistance of the transparent electrode, and hence the supporting base is also required to have heat resistance even in the case of the illumination application. Further, metal oxides such as ITO have been generally used for the transparent electrode and have a CTE of from 0 ppm/K to 10 ppm/K, and hence a resin having a CTE in the similar range is required in order to solve the problems of cracks and peeling.

In order to perform color display with an organic EL display device, materials capable of emitting light of three primary colors, i.e., red (R), green (G), and blue (B) are respectively deposited from the vapor for the respective colors through use of a shadow mask. However, this method has a problem in that it is very difficult and expensive to produce the shadow mask. Further, it is difficult to achieve high definition and an increase in size in the production of the shadow mask. In order to solve those problems, there has been proposed an organic EL display device that performs color display by a combination of a color filter with an organic EL emitting white light.

The color filter has a configuration in which a black matrix and colored layers of R, G, B, and other colors are formed on a base such as glass or a transparent film, and heat treatment of a resist at a temperature generally reaching 230° C. or more is regained for producing the color filter. Further, in order to reduce outgas from the resist that may have adverse effects on an EL element, heat treatment at a temperature of 300° C. or more is performed in some cases. Therefore, in the case where the coefficient of thermal expansion and the coefficient of humidity expansion of the supporting base in a display section including the EL element are not matched with those of the color filter, a difference is caused in dimension change between the respective substrates due to the changes in temperature and humidity, which causes warping and peeling. Thus, it is desired that the coefficient of thermal expansion and the coefficient of humidity expansion of the supporting base in the display section including the EL element be matched with those of the color filter, or the supporting base in the display section including the EL element and the base of the color filter be made of the same material.

The polyimide film is generally colored in yellowish brown. Therefore, there is a problem in that, in the case where minute foreign matter is mixed in the polyimide film, it is difficult to find the foreign matter with naked eyes or a visual inspection device. In particular, it is very difficult to find foreign matter such as rust of a metal having a color close to that of polyimide. The presence of the foreign matter in the polyimide film causes defects of a gas barrier layer to be formed on the polyimide film and failures such as disconnection and short circuiting between electrodes. The use of the polyimide film having transparency makes it easy to find the foreign matter and contributes to the prevention of a decrease in yield. Therefore, even in a display device such as electronic paper that does not require transparency as the function of the display device from the supporting base, the use of the polyimide film having transparency leads to the enhancement of productivity.

Similarly to the foreign matter, scratches on the surface of the polyimide film also cause defects of a gas barrier layer and failures such as disconnection and short circuiting between electrodes. In the case where the polyimide film is applied to the supporting base of a display device, a defect of 1 μm or less, which is allowed in a flexible printed wiring board that is the current main application of the polyimide film, presents a problem. In the currently commercially available polyimide films including general yellowish brown polyimide films (Kapton, Apical, Upilex, and the like) as well as the transparent polyimide film, those having a surface state applicable to the supporting base of a display device without any problems cannot be found.

Further, the transmittance in a visible light region of glass is generally about 90%, and in the case where a resin is used for the supporting base, it is necessary that the transmittance of the resin need to be set as close as possible to about 90%. The wavelength of light emitted from the light-emitting layer of the organic EL is mainly from 440 nm to 780 nm, and hence the supporting base used in the organic EL device is required to have an average transmittance of at least 80% in this wavelength region. In addition, it is desired that the resin itself forming the supporting base have moisture resistance.

There is a case in which, when the retardation in an in-plane direction of the supporting base is more than 10 nm, viewing angle characteristics of uniform contract may not be obtained. In the case where outside light enters the organic EL device, the electrodes reflect the outside light, with the result that the contrast decreases. In this case, there is a method of preventing the reflection of the outside light with a circularly polarizing plate. However, when the retardation is large, the effect of preventing the reflection of the outside light decreases. Thus, in order to obtain high contrast, it is appropriate that the retardation be as small as possible.

It has been known to obtain a polyimide film having a low coefficient of thermal expansion by stretching a film with a tenter so as to orient molecular chains. However, there is a problem in that the orientation of the molecular chains becomes non-uniform due to the variation in stress applied to the film during the stretching, with the result that anisotropy is caused in a refractive index so as to increase the retardation.

It has also been known to obtain a polyimide film having a low coefficient of thermal expansion without stretching the polyimide film by forming polyimide having a rigid chemical structure into a film under suitable conditions of heat treatment, film thickness, solvent type, and the like. However, there is a problem in that the molecular chains of the polyimide having a rigid chemical structure are easily oriented, and hence the orientation of the molecular chains becomes non-uniform due to the in-plane variation in temperature during heat treatment and film thickness so as to cause anisotropy in a refractive index with the result that the retardation increases.

Specifically, it is necessary to use a resin capable of concurrently satisfying at least a low CTE, heat resistance, and transparency for substituting a supporting base of a resin film for a glass substrate that has been hitherto used in the display device. However, the resin film for the supporting substrate of the display device capable of satisfying all the conditions has not existed. Further, in particular, it is important to control the physical property values at an interface between the resin film and the gas barrier layer in view of the specialty of the manufacturing process for the display device. Than, as a result of the repeated earnest studies by the inventors of the present invention, the inventors of the present invention have found that a display device excellent in dimension stability is obtained by forming polyimide containing a predetermined repeated structure into a polyimide film under specified production conditions and setting the difference in coefficient of thermal expansion between the polyimide and a gas barrier layer to 10 ppm/K or less. Thus, the present invention has been completed.

Thus, it is an object of the present invention to provide a display device, such as an organic EL display, an organic EL illuminator, electronic paper, and a liquid crystal display, which can be made thin, lightweight, and flexible, has no problems of cracks and peeling caused by thermal stress, is excellent in dimension stability, and can prevent a trouble in a manufacturing process so as to exhibit long-life and satisfactory element characteristics, and a manufacturing method therefor.

Further it is another object of the present invention to provide a polyimide for a display device supporting base, which can be made thin, lightweight, and flexible and can exhibit long-life and satisfactory characteristics, and a production method therefore. As used herein, the display device supporting base refers to a supporting base for forming the above-mentioned display device, the supporting base having a configuration in which any one or two or more of thin film transistors, an electrode layer, an organic EL light-emitting layer, electronic ink, and a color filter are formed on a polyimide film.

Solution to Problem

That is, according to one embodiment of the present invention, there is provided a display device, including: a supporting base including a polyimide film; and a gas barrier layer formed on the supporting base, in which the polyimide film has a transmittance of 80% or more in a wavelength region of from 440 nm to 780 nm, and a coefficient of thermal expansion of 15 ppm/K or less, and has a difference in coefficient of thermal expansion from the gas barrier layer of 10 ppm/K or less.

Further, according to one embodiment of the present invention, there is provided a polyimide film for a display device supporting base, which is used as a supporting base for forming a display device, the polyimide film having a transmittance of 80% or more in a wavelength region of from 440 nm to 780 nm and a coefficient of thermal expansion of 15 ppm/K or less.

Further, according to one embodiment of the present invention, there is provided a manufacturing method for a display device, the manufacturing method including: applying a resin solution of polyimide or a polyimide precursor onto a base substrate so that a thickness of a polyimide film becomes 50 μm or less; forming the polyimide film on the base substrate by completing heat treatment; forming a stress relaxation layer on the polyimide film; removing the base substrate under a state in which the polyimide film and the stress relaxation layer are laminated, and successively forming members for a display device, the polyimide film including a single polyimide layer or a plurality of polyimide layers including a main polyimide layer containing polyimide having 70 mol % or more of a structural unit represented by the following general formula (1).

General formula

[In the formula (1), $Ar_1$ represents a tetravalent organic group having an aromatic ring, and $Ar_2$ represents a divalent organic group represented by the following general formula (2) or (3).

General formula

(1)

[In the formula (1), $Ar_1$ represents a tetravalent organic group having an aromatic ring, and $Ar_2$ represents a divalent organic group represented by the following general formula (2) or (3).

General formula (2)

(3)

[In the general formula (2) or the general formula (3), $R_1$ to $R_8$ each independently represent a hydrogen atom, a fluorine atom, an alkyl group or alkoxy group having 1 to 5 carbon atoms, or a fluorine-substituted hydrocarbon group, and at least one of $R_1$ to $R_4$ in the general formula (2) and at least one of $R_1$ to $R_8$ in the general formula (3) each represent a fluorine atom or a fluorine-substituted hydrocarbon group.]]

Other polyimide resins that may be added in addition to the polyimide resin containing the structural unit represented by the general formula (1) can be selected from general acid anhydrides and diamines. It is desired that the acid anhydride and the diamine be selected so that the coefficient of thermal expansion does not become more than 15 ppm/K, and as needed, the acid anhydride and the diamine be adjusted for thickness and be multi-layered. It is desired that the addition amount of the acid anhydride and the diamine be set to up to 30 mol % or less, more preferably 10 mol % or less. As an acid anhydride that may be preferably used as the acid anhydride that satisfies such condition, there are given, for example, pyromellitic dianhydride, 3,3',4,4'-biphenyltetracarboxylic dianhydride, 1,4-cyclohexanedicarboxylic acid, 1,2,3,4-cyclobutanetetracarboxylic dianhydride, and 2,2'-bis(3,4-dicarboxyphenyl)hexafluoropropane dianhydride. As a diamine that may be preferably used as the diamine that satisfies such condition, there are given, for example, 4,4'-diaminodiphenyl sulfone, trans-1,4-diaminocyclohexane, 4,4'-diaminocyclohexylmethane, 2,2'-bis(4-aminocyclohexyl)-hexafluoropropane, and 2,2'-bis(trifluoromethyl)-4,4'-diaminobicyclohexane.

As described above, it is preferred that the polyimide film of the present invention contain a fluorine atom or a fluorine- General formula (2)

(3)

[In the general formula (2) or the general formula (3), $R_1$ to $R_8$ each independently represent a hydrogen atom, a fluorine atom, an alkyl group or alkoxy group having 1 to 5 carbon atoms, or a fluorine-substituted hydrocarbon group, and at least one of $R_1$ to $R_4$ in the general formula (2) and at least one of $R_1$ to $R_8$ in the general formula (3) each represent a fluorine atom or a fluorine-substituted hydrocarbon group.]]

In addition, according to one embodiment of the present invention, there is provided a production method for a polyimide film for a display device supporting base, the production method including: applying a resin solution of polyimide or a polyimide precursor onto a base substrate so that a thickness of a polyimide film becomes 50 μm or less; forming the polyimide film on the base substrate by completing heat treatment; forming a stress relaxation layer on the polyimide film; and removing the base substrate under a state in which the polyimide film and the stress relaxation layer are laminated, the polyimide film including a single polyimide layer or a plurality of polyimide layers including a main polyimide layer containing polyimide having 70 mol % or more of a structural unit represented by the following general formula (1).

The polyimide film can be produced by polymerizing a diamine and an acid anhydride serving as raw materials in the presence of a solvent so as to obtain a polyimide precursor resin, and imidizing the polyimide precursor resin by heat treatment. The molecular weight of the polyimide resin can be mainly controlled by changing the molar ratio between the diamine and the acid anhydride serving as the raw materials, and the molar ratio is generally 1:1. Examples of the solvent include dimethylacetamide, dimethylformamide, n-methylpyrrolidinone, 2-butanone, diglyme, and xylene. One kind of the solvents may be used alone, or two or more kinds thereof may be used in combination.

Each of the diamine and the acid dianhydride serving as the raw materials for the polyimide film used in the present invention may be formed of a single kind of monomer or a plurality of kinds of monomers. The polyimide film of the present invention is preferably formed of polyimide having a structural unit represented by the following general formula (1). Alternatively, the polyimide film of the present invention is preferably formed of a copolymer using a plurality of kinds of monomers each having the structural unit represented by the following general formula (1), more preferably formed of a polyimide resin containing 70 mol % or more, preferably 90 mol % to 100 mol % of the structural unit represented by the general formula (1).

substituted hydrocarbon group in a part of the chemical structure. For this purpose, the fluorine atom or the fluorine-substituted hydrocarbon group may be contained in Ar$_1$ or Ar$_2$ or in both Ar$_1$ and Ar$_2$ in the general formula (1). In a more preferred embodiment, it is appropriate that at least one of R$_1$ to R$_4$ in the general formula (2) represent a fluorine atom or a fluorine-substituted hydrocarbon group, and at least one of R$_1$ to R$_8$ in the general formula (3) represent a fluorine atom or a fluorine-substituted hydrocarbon group.

Specific preferred examples of R$_1$ to R$_8$ include —H, —CH$_3$, —OCH$_3$, —F, and —CF$_3$, and it is more preferred that at least one of R$_1$ to R$_8$ represent any one of —F and —CF$_3$.

Further, specific examples of Ar$_1$ in the general formula (1) include the following tetravalent acid anhydride residues.

Further, specific examples of the diamine residue that provides Ar$_2$ in the general formula (1) include the following.

A particularly preferred construction of the polyimide for forming the polyimide film to be used in the present invention is polyimide formed of structural units represented by the following formulae (4) and (5). In this case, the ratio between the content of the structural unit represented by the formula (4) and the content of the structural unit represented by the formula (5) in the polyimide is, in terms of molar ratio, "(4):(5)"=50:50 to 100:0, preferably "(4):(5)"=70:30 to 95:5, more preferably "(4):(5)"=85:15 to 95:5. The content of those structural units in the polyimide is from 90 mol % to 100 mol %.

In this case, the structural unit represented by the general formula (4) is mainly effective for enhancing the properties such as low thermal expandability and high heat resistance, and the structural unit represented by the general formula (5) is mainly effective for enhancing high transparency. The polyimide film according to such a preferred embodiment does not exclude including structural units other than the structural units "a" and "b" represented by the general formulae (4) and (5). Note that, the polyimide film preferably includes the structural units other than the structural units "a" and "b" within a range of less than 10% in terms of molar ratio, and most preferably includes only the structural units "a" and "b".

In the above-mentioned description, the polyimide film of the present invention may include the structural units other than those represented by the formulae (4) and (5) within a range of less than 10 mol %. The diamine and the acid anhydride serving as the raw materials used in the present invention are not particularly limited, and one kind of diamine and acid anhydride appropriately selected from known diamines and acid anhydrides may be used alone, or two or more kinds thereof may be used in combination.

The polyimide film can be produced by polymerizing the diamine and the acid anhydride serving as the raw materials in the presence of the solvent so as to obtain a polyimide precursor resin and imidizing the polyimide precursor resin by heat treatment. The molecular weight of the polyimide resin can be mainly controlled by changing the molar ratio between the diamine and the acid anhydride serving as the raw materials, and the molar ratio is generally 1:1.

The production method involves first dissolving a diamine in an organic solvent and adding an acid dianhydride to the solution thus obtained so as to produce polyamide acid serving as a polyimide precursor. Examples of the organic solvent include dimethylacetamide, dimethylformamide, n-methylpyrrolidinone, 2-butanone, diglyme, and xylene. One kind of those solvents may be used alone, or two or more kind thereof may be used in combination. The subsequent imidization step can also be conducted through use of chemical imidization using a condensation agent such as acetic anhydride, besides thermal imidization utilizing thermal dehydration described in the following production method for a polyimide film.

As the production method for a polyimide film, the following method is excellent in productivity and has been most widely performed industrially. The method involves casting and applying a resin solution of polyamide acid or polyimide serving as a raw material for a polyimide film onto a base substrate such as a metal roll, drying the resin solution by heating on the base substrate so as to obtain a gel film having self-supporting property, peeling the gel film from the base substrate and further heating the gel film at high temperature while holding the gel film with a tenter or the like so as to obtain a polyimide film. However, in this method, the gel film is stretched due to the stress applied thereto during the peeling of the gel film from the base substrate and the tension of the tenter during the heat treatment, with the result that the retardation increases. Therefore, this method is not preferred as the production method for a polyimide film of the present invention.

As the production method for a polyimide film of the present invention, for example, the following method is preferred. The method involves casting and applying a resin solution of polyamide acid onto any base substrate made of a copper foil with an applicator, predrying the resin solution, further removing a solvent from the resin solution, subjecting the resultant to heat treatment so as to imidize the resultant, and removing the base substrate used during the imidization by peeling, etching, or the like. When the resin solution is cast and applied onto the base substrate, it is preferred that the viscosity of the resin solution be set within a range of from 500 cps to 70,000 cps. Further, the resin solution may be applied onto the base substrate serving as an application surface for the resin solution after the surface of the base substrate is appropriately subjected to surface treatment. In the above-mentioned description, it is appropriate that the drying condition be from 2 minutes to 30 minutes at 150° C. or less, and the heat treatment for imidization be performed at a temperature of from about 130° C. to about 360° C. for from 2 minutes to 30 minutes.

In order to decrease the retardation in an in-plane direction in the above-mentioned production method for a polyimide film involving applying the resin solution of polyamide acid onto the base substrate and removing the polyimide film from the base substrate after the completion of the heat treatment, it is appropriate that the in-plane variation in film temperature during the heat treatment be reduced. The in-plane variation in film temperature during the heat treatment is preferably 6° C. or less, more preferably 2° C. or less.

In order to reduce the in-plane variation in film temperature, it is appropriate that a laminate of the polyamide acid resin and the base substrate be subjected to heat treatment in a forced convection type oven that has been left for a sufficient period of time after reaching a predetermined temperature and has reached a uniform furnace temperature. Further, when the laminate of the resin and the supporting base is brought into direct contact with an inner surface of the furnace and a shelf plate during heating, a local variation in temperature may occur, and hence it is preferred that the laminate be set so as to be prevented from being brought into contact with the inner surface of the furnace and the shelf plate as much as possible. Further, the laminate of the polyamide acid resin and the base substrate may be preheated before the heat treatment.

It is not preferred that the thickness of the base substrate be large because the heat capacity increases and the resin is not heated sufficiently from the base substrate side, which causes the variation in temperature in the plane of the film. The thickness of the supporting base is preferably 3 mm or less, more preferably 0.8 mm or less. Further, in order to reduce the variation in temperature, a metal having a high heat conductivity may be used for the base substrate.

Further, in order to decrease the retardation in the in-plane direction, it is preferred that the in-plane variation in the thickness of the film be reduced. The in-plane variation in the thickness of the polyimide film after the completion of the heat treatment is preferably $1/10$ or less, more preferably $1/20$ or less of the film thickness.

The above-mentioned application method is not particularly limited. As long as predetermined thickness accuracy is obtained, known methods such as a spin coater, a spray coater, a bar coater, or an extrusion method using a slit-shaped nozzle can be applied. In general, it has been known that, in the case where a solution of a resin having high orientation containing rigid molecular chains is applied to a substrate, the retardation occurs due to the shear stress generated during the application. Surprisingly, the application method does not influence the retardation in the present invention. Therefore, any application method satisfying both the film thickness accuracy and the productivity can be selected.

Due to the above-mentioned heat treatment, a polyimide film having small retardation in the in-plane direction while keeping a low coefficient of thermal expansion and having a transmittance of 80% or more in a wavelength region of from 440 nm to 780 nm is obtained on the base substrate. In the present invention, it is preferred that the heating time, in particular, in a high heating temperature range from a temperature lower by 20° C. than the highest heating temperature (highest attained temperature) to the highest attained temperature during the increase in temperature in the above-mentioned heat treatment (hereinafter referred to as "high-temperature retention time") be set within 15 minutes. When the high-temperature retention time exceeds 15 minutes, the transparency of the polyimide film tends to be degraded due to the coloring and the like. In order to maintain the transparency, it is appropriate that the high-temperature retention time be shorter, but there is a risk in that the effect of the heat treatment may not be sufficiently obtained when the time is too short. The optimum high-temperature retention time is preferably set to 0.5 minute or more and 5 minutes or less although the optimum high-temperature retention time varies depending on the heating method, the heat capacity of the base substrate, the thickness of the polyimide film, and the like.

In the case of removing the base substrate by etching in the above-mentioned production method for a polyimide film involving applying a resin solution of polyamide acid onto the base substrate and removing the polyimide film from the base substrate after the completion of the heat treatment, the following steps are general performed: the base substrate is removed from the polyimide film by etching; the polyimide film is washed with running water; water droplets on the surface of the polyimide film are removed with an air knife; and the polyimide film is dried by heating in an oven. When the polyimide film is stretched with the stress generated with respect to the polyimide film during those steps, the retardation in the in-plane direction increases. This tendency is particularly conspicuous in a polyimide film having a low coefficient of thermal expansion because the polyimide film has rigid molecular chains. Therefore, it is preferred to reduce the stress applied to the film in the plane direction after a single polyimide film is obtained by etching the base.

In order to prevent the stretching of the polyimide film in a series of processes involving etching, the following method may be used. The method involves forming a stress relaxation layer on a polyimide film and etching a base substrate under a state in which the polyimide film and the stress relaxation layer are laminated so that the stress generated during the process is dispersed to the polyimide film and the stress relaxation layer. Although the method of forming the stress relaxation layer is not particularly limited, for example, the stress relaxation layer can be formed by a method involving bonding a resin film or metal foil having a coefficient of thermal expansion suitable as the stress relaxation layer to a polyimide film with a pressure-sensitive adhesive, followed by application, vapor deposition, and sputtering.

In the case of removing the base substrate by peeling in the above-mentioned production method for a polyimide film involving applying a resin solution of polyamide acid onto the base substrate and removing the polyimide film from the base substrate after the completion of the heat treatment, when the polyimide film is stretched in the plane direction due to the stress applied to the polyimide film during the peeling, the retardation in the in-plane direction increases. Therefore, it is preferred to perform the peeling so that the stress to be applied to the polyimide film in the plane direction during the peeling is small.

In order to prevent the stretching of the polyimide film during the peeling of the polyimide film from the base substrate, the following method may be used. The method involves forming a stress relaxation layer on a polyimide film and peeling the polyimide film from the base substrate under a state in which the polyimide film and the stress relaxation layer are laminated so that the stress required for the peeling is dispersed to the polyimide film and the stress relaxation layer.

The above-mentioned stress relaxation layer may be formed directly on the polyimide film or may be formed on the polyimide film including functional layers such as an electrode layer, a light-emitting layer, thin film transistors, a wiring layer, and a barrier layer formed thereon.

The stress relaxation layer may serve as a member for forming the display device while being laminated on the polyimide film without being separated therefrom after the removal of the polyimide film from the base substrate. Examples of the member for forming the display device include a display section such as an organic EL light-emitting layer or electronic paper, an adhesive, a pressure-sensitive adhesive, a barrier film, a protective film, and a color filter. Herein, in the case of the display device including a color filter, a color filter layer formed of a black matrix and colored sections of R, G, B, and the like may be formed on the polyimide film before the polyimide film is peeled from the base substrate so that the color filter layer serves as a stress relaxation layer.

Further, in order to facilitate the peeling of the polyimide film from the base substrate so as to prevent the stretching of the polyimide film, the following method may be used. The method involves fixing a polyimide film to another substrate, peeling the polyimide film fixed to the substrate from a base substrate while preventing the stretching of the polyimide film in the plane direction, and then separating the polyimide film from the substrate. The method of fixing a polyimide film to a base may be a method involving preparing a base having fine holes extending from an inside of the base to a surface thereof, reducing the pressure inside the base, peeling the polyimide film from a base substrate while keeping the polyimide film fixed to the surface of the base through use of the vacuum, returning the reduced pressure inside the base to ambient pressure, and separating the polyimide film from the base. The above-mentioned base may be a resin or a metal such as stainless steel. The surface of the base on the polyimide film side may be curved.

In order to prevent the stretching of the polyimide film during the peeling of the polyimide film from the base substrate, other known methods can also be applied. In JP 2007-512568 A, there is a disclosure that a yellow film of polyimide or the like is formed on glass, thin film electronic elements are formed on the yellow film, and a bottom surface of the yellow film is irradiated with UV laser light through the glass so that the glass and the yellow film are peeled from each other. This method is one of the preferred methods as a peeling process of the present invention because the polyimide film is separated from the glass with UV laser light so that the stress is not generated during the peeling. However, there is also a disclosure that, unlike the yellow film, a transparent plastic does not absorb UV laser light, and hence it is necessary to form an absorption/peeling layer of amorphous silicon under the film in advance.

JP 2012-511173 A discloses that, in order to peel the glass and the polyimide film from each other through the irradiation with UV laser light, it is necessary to use a laser having a spectrum within a range of from 300 nm to 410 nm.

The wavelength of light emitted from an organic EL light-emitting layer is mainly from 440 nm to 780 nm, and hence the supporting base used in the organic EL device is required to have an average transmittance of at least 80% or more in the above-mentioned wavelength region. On the other hand, in the case of peeling the glass and the polyimide film from each other through the irradiation with UV laser light as described above, when the transmittance of the supporting base at the wavelength of the UV laser light is high, it is necessary to form an absorption/peeling layer under the film, which decreases the productivity. In order to perform the peeling without forming the absorption/peeling layer, the polyimide film itself needs to absorb laser light. Therefore, the transmittance of the polyimide film at 400 nm is preferably 80% or less, more preferably 60% or less, still more preferably 40% or less. Thus, the peeling can be performed through the irradiation with UV laser light without forming the absorption/peeling layer in spite of the fact that the polyimide film is transparent.

Further, in the present invention, the polyimide film has a thickness within a range of preferably from 1 μm to 50 μm, more preferably from 3 μm to 40 μm, particularly preferably from 5 μm to 30 μm. When the thickness of the polyimide film is less than 1 μm, it is difficult to control the thickness with an applicator, with the result that the thickness is liable to become non-uniform. In contrast, when the thickness of the polyimide film is more than 50 μm, there is a risk in that the heat resistance and the light transmittance may be degraded.

In this case, from the viewpoint of controlling the film thickness to be uniform during the application using an applicator or the like, it is preferred that the polymerization degree of the polyamide acid and polyimide to be used for forming the polyimide film fall within a range of from 500 cP to 200,000 cP in terms of solution viscosity when the polymerization degree is represented by the viscosity range of the polyamide acid solution.

The polyimide film serving as the supporting base in the present invention may be formed of a plurality of polyimide layers as long as the polyimide film satisfies a transmittance of 80% or more in a wavelength region of from 440 nm to 780 nm, a coefficient of thermal expansion of 15 ppm/K or less, and a difference in coefficient of thermal expansion from the gas barrier layer of 10 ppm/K or less. That is, the polyimide having the structural unit represented by the general formula (1) has relatively hard property having a modulus or elasticity of from about 5 GPa to about 10 GPa. Therefore, a polyimide layer having a modulus of elasticity lower than this range may be arranged so as to be brought into contact with the gas barrier layer so that the polyimide layer serves for stress relaxation.

In the case of using a plurality of polyimide layers, it is preferred that a polyimide layer to be brought into contact with the gas barrier layer have a modulus of elasticity lower than that of a polyimide layer (main polyimide layer) having a largest thickness in the polyimide film. The polyimide layer to be brought into contact with the gas barrier layer also serves as a stress relaxation layer for preventing the stretching of the main polyimide layer having a low coefficient of thermal expansion, and hence the retardation of the polyimide film having low thermal expandability can be further decreased.

In this case, the modulus of elasticity of the polyimide layer to be brought into contact with the gas barrier layer is preferably less than 5 GPa, more preferably 0.1 GPa or more and less than 5 GPa, particularly preferably 2 GPa or more and less than 5 GPa. The polyimide layer having such a modulus of elasticity can be formed of widely known polyimides, and in general, the transmittance in a visible light region of those polyimides is lower than that of the polyimide having the structural unit represented by the general formula (1), and the CTE thereof is relatively high. Therefore, it is appropriate that the polyimide layer to be brought into contact with the gas barrier layer have a thickness of from 0.5 μm to 10 μm, preferably from 1 μm to 5 μm. That is, in the case of forming the polyimide film of a plurality of polyimide layers, it is preferred that the polyimide layer (main polyimide layer) having a largest thickness in the polyimide film be formed of the structural unit represented by the general formula (1), and the polyimide layer having a modulus of elasticity lower than that of the main polyimide layer be arranged on the gas barrier layer side so that the polyimide layer to be brought into contact with the gas barrier layer has a modulus of elasticity lower than that of another polyimide layer adjacent to the polyimide layer to be brought into contact with the gas barrier layer. The thickness ratio between the thickness of the main polyimide layer and the polyimide layer having a low modulus of elasticity (main polyimide layer/polyimide layer having a low modulus of elasticity) in the case of forming the polyimide film of a plurality of polyimide layers is preferably from 3 to 50, more preferably from 5 to 20.

It is only necessary that the polyimide film used in the present invention have a transmittance of 80% or more in a wavelength region of from 440 nm to 780 nm at a predetermined thickness, and the thickness range is not particularly limited. Preferably, it is appropriate that, in the case of forming a polyimide film having a thickness of 25 μm, the polyimide film be formed of polyimide that imparts a transmittance of 80% or more in a wavelength region of from 440 nm to 780 nm, and such polyimide is formed of the above-mentioned polyimide. The polyimides represented by the general formulae (4) and (5) are particularly preferred.

The present invention relates to an organic EL device including a supporting base including a polyimide film, a gas barrier layer formed on the supporting base, and an organic EL light-emitting layer formed above the gas barrier layer. As described above, in the organic EL device using a resin as the supporting base, the gas barrier layer is generally formed on at least one surface of the supporting base so as to prevent the entry of water and oxygen into the organic EL light-emitting layer. In this case, as the gas barrier layer having barrier property with respect to oxygen, water vapor, and the like, there are preferably illustrated films formed of inorganic oxides such as silicon oxide, aluminum oxide, silicon carbide, silicon oxycarbide, silicon carbonitride, silicon nitride, and silicon oxynitride. In this case, when the difference in CTE between the gas barrier layer of any of these inorganic oxides and the polyimide film serving as the supporting base is large, there is a risk in that curling may occur, dimension stability may be degraded, and cracks may occur during the later production process for TFTs. Further, in general, there is a problem of warping in the case of producing a film having a large area. However, the polyimide film of the present invention has a small difference in CTE from the gas barrier layer, and hence such trouble can be solved. Note that, Table 1 shows typical inorganic films for forming the gas barrier layer and coefficients of thermal expansion thereof. In this case, the coefficient of thermal expansion varies depending on the production method even when the composition is the same, and hence the values shown in Table 1 are merely guidelines. Further, the gas barrier layer may be formed of one kind of the above-mentioned inorganic films or may be formed so as to include two or more kinds thereof.

TABLE 1

| Name of substance | Composition | Coefficient of thermal expansion (ppm/K) |
| --- | --- | --- |
| Silicon carbide | $SiC_x$ | 4.0 to 6.5 |
| Silicon oxide | $SiO_x$ | 0.5 to 5.0 |
| Silicon oxycarbide | SiOC | 10.0 |
| Silicon carbonitride | SiCN | 4.0 to 6.5 |
| Aluminum oxide | $Al_2O_3$ | 6.0 to 9.0 |
| Silicon nitride | $SiN_x$ | 2.0 to 5.4 |
| Silicon oxynitride | SiON | 0.5 to 5.4 |

As is understood from Table 1, the CTE of the materials for forming the gas barrier layer falls within a range of from 0 ppm/K to 10 ppm/K. Therefore, in the case where the CTE of the polyimide film adjacent to the gas barrier layer is not a value close to this range, warping and the like may occur. Therefore, the polyimide film of the present invention is set to have a coefficient of thermal expansion of 15 ppm/K or less, preferably from 0 ppm/K to 10 ppm/K, and a difference in coefficient of thermal expansion from the gas barrier layer of 10 ppm/K or less, preferably from 0 ppm/K to 5 ppm/K. Note that, in the case where the polyimide film is formed of a plurality of polyimide layers, the coefficient of thermal expansion of the entire polyimide film is shown (the same applies to the other characteristics of the polyimide film).

Further, the polyimide film of the present invention has a transmittance of 80% or more, preferably 83% or more in a wavelength region of frost 440 nm to 780 nm. When the transmittance is less than 80% in the wavelength region, emitted light cannot be extracted sufficiently (in particular, in the case of the bottom-emission structure). Further, it is appropriate that the polyimide film, of the present invention have a heating weight loss of 1.5% or less, preferably 1.3% or less when held at 400° C. for 90 minutes. When the heating weight loss is more than 1.5%, the polyimide film cannot withstand the production process temperature of the TFTs.

In addition, it is appropriate that the retardation in the in-plane direction of the polyimide film be 10 nm or less, preferably 5 nm or less. When the retardation in the in-plane direction is more than 10 nm, the viewing angle characteristics of uniform contrast may not be obtained. In the case where outside light enters the organic EL device, the electrodes reflect the outside light, with the result that the contrast decreases. In this case, there is a method of preventing the reflection of the outside light with a circularly polarizing plate. However, when the retardation is large, the effect of preventing the reflection of the outside light is degraded. Thus, in order to obtain high contrast, it is appropriate that the retardation be as small as possible. Further, it is appropriate that the surface roughness Ra of the polyimide film be 5 nm or less, preferably 4 nm or less. When the surface roughness Ra is more than 5 nm, the thickness of the organic EL layer becomes non-uniform, which causes disconnection, a variation in emission, and a decrease in color reproducibility. Still further, it is appropriate that the polyimide film of the present invention have a coefficient of humidity expansion of 15 ppm/% RH or less, preferably from 0 ppm/% RH to 10 ppm/% RH. When the coefficient of humidity expansion is more than 15 ppm/% RH, positional displacement caused by a change in dimension during the TFT process and troubles in a reliability test occur.

Advantageous Effects of Invention

The organic EL device of the present invention uses the polyimide film having predetermined characteristics as the supporting base, and hence the organic EL device having the performance equivalent to that of related-art products can be realized by the manufacturing method substantially equivalent to that for a glass substrate that has been generally used hitherto, while being able to be made thin, lightweight, and flexible.

DESCRIPTION OF EMBODIMENTS

The present invention is described in more detail with reference to the drawings. Note that, in each of figures and Examples, the same or similar component members are denoted by the same reference numeral and the description thereof is omitted.

Figure 1:
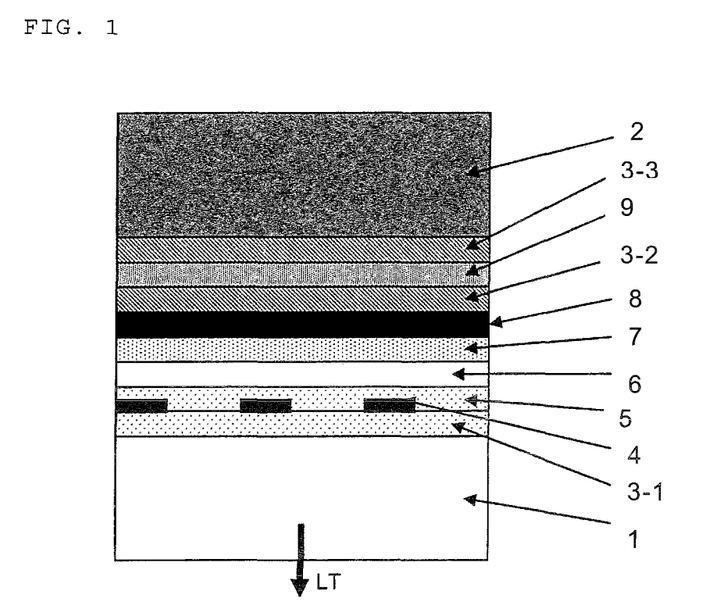
FIG. 1 is a schematic sectional view illustrating an example of an organic EL device having a bottom-emission structure of the present invention.

FIG. 1 is a schematic sectional view illustrating an organic EL device having a bottom-emission structure according to the present invention. Reference numeral 1 in FIG. 1 denotes a supporting base, and in the present invention, the supporting base 1 is formed of a polyimide film. A gas barrier layer 3-1 is formed on one surface (principal surface) of the supporting base 1. The gas barrier layer 3-1 prevents moisture from permeating the supporting base 1. Further, a circuit-forming layer 5 including thin film transistors (TFTs) (not shown) is formed on an upper surface of the gas barrier layer 3-1. The circuit-forming layer 5 is configured in such a manner that, for example, an anode electrode 6 formed of a transparent conductive film of Indium tin oxide (ITO) is formed on an upper surface of the circuit-forming layer 5 so as to correspond to each of pixel regions arranged in matrix.

Further, a light-emitting layer 7 is formed on an upper surface of the anode electrode 6, and a cathode electrode 8 is formed on an upper surface of the light-emitting layer 7. The cathode electrode 8 is formed in common to the respective pixel regions. A gas barrier layer 3-2 is formed so as to cover a surface of the cathode electrode 8. Further, a sealing substrate 2 for surface protection is arranged on an outermost surface of the organic EL device. It is preferred that the gas barrier layer 3-3 be formed on a surface of the sealing substrate 2 on the cathode electrode 8 side. Further, it is desired that the sealing substrate 2 be bonded onto the cathode electrode 8 with an adhesive (adhesive layer) 9 containing a desiccant. Thus, the organic EL device generally has a configuration in which the respective thin films are formed on the supporting base 1 in the stated order, and the thin films thus formed are sealed with the sealing substrate 2 finally. In general, the sealing substrate 2 is bonded onto the cathode electrode 8 with an adhesive containing a water-absorbing material.

In this case, thin film transistors having a high mobility are required for driving the organic EL device, and in general, low-temperature polysilicon TFTs are used. It is generally considered to be appropriate that the treatment temperature of the TFTs be 450° C. or more. Further, oxide semiconductor TFTs using IGZO having a relatively high mobility in low-temperature treatment have been studied. However, it is becoming clear from the recent finding that the high-temperature treatment at 400° C. or more is required for increasing the stability of the TFTs. Therefore, it is necessary that the polyimide film serving as the supporting base withstand the heat treatment step of the TFTs.

Further, the light-emitting layer 7 is formed of a multi-layered film (anode electrode-light-emitting layer 7-cathode electrode) such as a hole injection layer-hole transport layer-light-emitting layer-electron transport layer. In particular, the light-emitting layer 7 is degraded due to water and oxygen. Therefore, in general, the light-emitting layer 7 is formed by vacuum vapor deposition, and the electrodes and the light-emitting layer 7 are formed continuously in vacuum.

Figure 2:
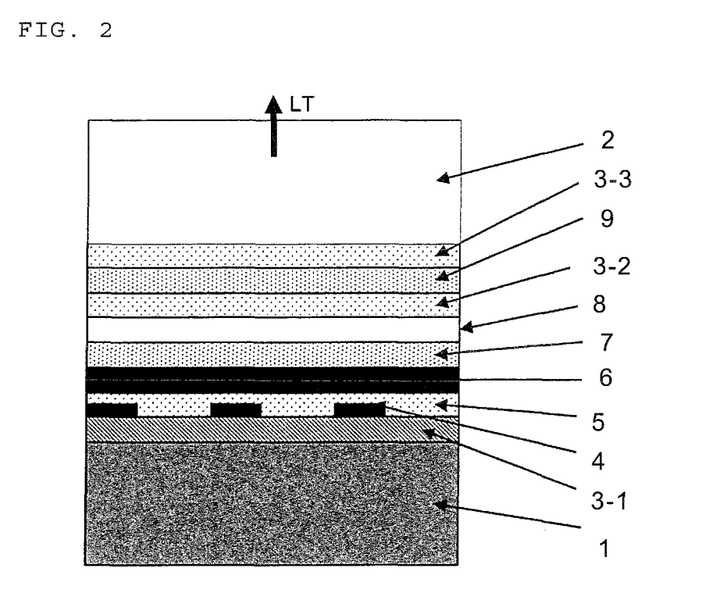
FIG. 2 is a schematic sectional view illustrating an example of an organic EL device having a top-emission structure of the present invention.

FIG. 2 is a schematic sectional view illustrating an organic EL device having a top-emission structure. In FIG. 2, the supporting base 1 is formed of a transparent polyimide film. The gas barrier layer 3-1 is formed on one surface (principal surface) of the supper ting base 1. The gas barrier layer 3-1 prevents moisture from permeating the supporting base 1. The circuit-forming layer 5 including thin film transistors 4 (details thereof are not shown) is formed on an upper surface of the gas barrier layer 3-1. In the case of the top-emission structure, light can also be extracted from above the thin film transistors 4, and hence the use efficiency of light increases. The circuit-forming layer 5 is configured in such a manner that, for example, a metal thin film serving as a reflection electrode and an indium tin oxide (ITO) thin film for adjusting a work function are formed as the anode electrode 6 on an upper surface of the circuit-forming layer 5 so as to correspond to each of pixel regions arranged in matrix. The light-emitting layer 7 is formed on an upper surface of the anode electrode 6, and the cathode electrode 8 is formed on an upper surface of the light-emitting layer 7. The cathode electrode 8 is formed in common to the respective pixel regions. As the cathode electrode 8, a semi-transparent thin film of silver, an alloy thereof, or the like capable of adjusting a work function and transmitting a part of light is generally used. In order to reduce the electrode resistance, a transparent electrode of indium zinc oxide (IZO) is generally laminated on the semi-transparent thin film.

Further, the gas barrier layer 3-2 is formed so as to cover the surface of the cathode electrode 8. Further, the sealing substrate 2 for surface protection is arranged on the outermost surface of the organic EL device. It is preferred that the barrier layer 3-3 be formed on the surface of the sealing substrate 2 on the cathode electrode 8 side. The sealing substrate 2 is generally bonded onto the cathode electrode 8 with the adhesive 9 containing a desiccant. It is necessary that the gas barrier layer 3-2, the adhesive 9, the gas barrier layer 3-3, and the sealing substrate 2 be transparent.

In the case of the top-emission structure, the supporting base 1 is not necessarily required to be transparent. However, when the supporting base 1 is transparent, a TFT pattern and the like can be observed from the surface on the supporting base side. Thus, there is obtained another effect of the transparent supporting base. On the other hand, the sealing substrate 2 is required to be transparent. If the polyimide film of the present invention is also used for the sealing substrate 2, the coefficient of thermal expansion and coefficient of humidity expansion of the supporting base 1 become the same as those of the sealing substrate 2, and hence there is obtained an effect that the completed organic EL device is less liable to be warped or broken by warping.

Further, the organic EL device of the present invention can also be applied to organic EL illuminators. In this case, the organic EL illuminators generally have the bottom-emission structure excluding the thin film transistor 4 layer of FIG. 1. However, due to the absence of the thin film transistors 4, the anode electrode 6 needs to have low resistance. In general, a transparent electrode of indium tin oxide (ITO) or the like is used for the anode electrode 6, and the electrode resistance decreases as the transparent electrode is treated at higher temperature. The ITO is generally subjected to heat treatment at from 200° C. to 300° C. Note that, the organic EL illuminators tend to be enlarged, and the resistance is becoming insufficient with the ITO electrode. Thus, various alternative electrode materials have been searched. In this case, in general, there is a high possibility that the temperature further higher than the temperature within a range of from 200° C. to 300° C. is required, and the polyimide film of the present invention can be preferably used.

EXAMPLES

The present invention is more specifically described below by way of Examples. However, the present invention is not limited to the scope of Examples below.

(Formation Method for Polyimide Film Serving as Supporting Base and Characteristics Thereof)

First, abbreviations of a monomer and a solvent to be used in synthesizing polyimide, and a measurement method of various physical properties in the examples and conditions thereof are described below.

TFMB: 2,2'-bis(trifluoromethyl)-4,4'-diaminobiphenyl
PMDA: pyromellitic dianhydride
DMAc: N,N-dimethylacetamide
6FDA: 2,2'-bis(3,4-dicarboxyphenyl)hexafluoropropane dianhydride
BPDA: 3,3',4,4'-biphenyltetracarboxylic dianhydride "Coefficient of Thermal Expansion (CTE)"

A polyimide film having a size of 3 mm×15 mm was subjected to a tensile test in a temperature range of from 30° C. to 260° C. at a predetermined temperature increase rate (20° C./min) under a load of 5.0 g with a thermal mechanical analyzer (TMA) so that a coefficient of thermal expansion (ppm/K) was measured based on the stretched amount of the polyimide film with respect to the temperature.

"Transmittance"

A polyimide film (50 mm×50 mm) was measured for an average value of light transmittance in a wavelength region of from 440 nm to 780 nm with a U4000 spectrophotometer.

"Thermal Weight Loss"

A polyimide film was held in nitrogen at 460° C. for 90 minutes and measured for a weight loss before and after heating through use of TG/DTA7200 manufactured by SII Nano Technology Inc.

"Retardation"

The retardation in an in-plane direction of a polyimide film was determined through use of a spectroscopic polarimeter "Poxi-spectra" manufactured by Tokyo Instruments, Inc. The measurement was conducted in a wavelength region of from 400 nm to 800 nm. Table 2 shows measured values at a wavelength of 600 nm.

"Surface Roughness"

A surface of a polyimide film that was not held in contact with a base substrate during the formation of the film was observed for surface roughness Ra in a tapping mode through use of an atomic force microscope (AFM) "Multi Mode 8" manufactured by Bruker Japan Co., Ltd. A visual field measuring 10 µm per side was observed four times, and an average thereof was determined. The surface roughness (Ra) represents an arithmetic average roughness (JIS B0601-1991).

"Surface Scratches"

An air surface (surface that was not held in contact with a base substrate during the formation of a film) of a polyimide film was observed for the presence or absence of scratches in a scan-assist mode through use of an atomic force microscope (AFM) "Multi Mode 8" manufactured by Bruker Japan Co., Ltd. A visual field measuring 20 µm per side was observed four times. In the case where no scratches were observed, the result was indicated by Symbol "o". In the case where minute scratches were observed, the result was indicated by Symbol "Δ". In the case where streak-like scratched were observed, the result was indicated by Symbol "x".

[Coefficient of Humidity Expansion]

A laminate of a copper foil and a polyimide film was cut to a size of 25 cm×25 cm. An etching resist layer was formed on the copper foil side, and the resultant was formed into a pattern in which 16 dots each having a diameter of 1 mm were arranged at an interval of 10 cm on four sides of a square measuring 30 cm per side. Exposed portions of etching resist openings were etched to obtain a polyimide film for CHE measurement having 16 copper foil remaining points. The polyimide film was dried at 120° C. for 2 hours. After that, the polyimide film was left stand still at each humidity for 24 hours in a constant temperature and humidity device having a relative humidity of 30% RH, 50% RH, or 70% RH at 23° C., and a coefficient of humidity expansion (ppm/% RH) was determined based on a change in dimension between the copper foil points at each humidity measured with a two-dimensional length measuring machine. The polyimide film formed on glass was peeled from the glass, and then a pattern was marked on the polyimide film so that a coefficient of humidity expansion (ppm/% RH) was determined in the same way as the above.

"Cracks"

A silicon nitride film having a thickness of 50 nm was formed by CVP, and the occurrence of cracks was observed with a microscope "KH-7700" manufactured by Yamato Scientific Co., Ltd. In the case where the number of cracks was 10 or more in a visual field measuring 10 mm per side, the evaluation result was indicated by Symbol "x". In the case where the number of cracks was 1 or more and less than 9, the evaluation result was indicated by Symbol "o". In the case where no cracks were observed, the evaluation result was indicated by a word "none".

"Curling"

A silicon oxide film having a thickness of 50 nm was formed as a gas barrier layer by CVD, and polyimide-gas barrier layer laminates measuring 10 cm per side and 100 cm per side were prepared. Four curling corners of each laminate when the laminates were placed on a plane with a convex surface directed downward were visually observed.

Next, the production conditions in Examples are described below.

"Application"

An applicator adjusted so that the in-plane variation in thickness of a polyimide film after heat treatment became 1 µm or less was used.

"Heat Treatment"

In heat treatment using a hot air oven, the heat treatment was started one hour after the temperature reached a predetermined temperature through use of a forced convection type hot air oven having a blast fan. A laminate of a base substrate and a resin was positioned at the center of the hot air oven, against which the hot air was most strongly blown. The laminate was set on a table formed of a stainless wire so as not to intervene in the circulation of the hot air, and subjected to the heat treatment. The temperature variation of the laminate at this position was 2° C.

In heat treatment using a nitrogen oven, the heat treatment was conducted by a general method without considering the retardation in particular. That is, a laminate of a base substrate and a resin was set on an attached shelf plate (stainless punching metal) and subjected to the heat treatment through use of a nitrogen oven set to a predetermined temperature. The temperature variation of the nitrogen oven was 6° C.

Example 1

Polyimide A 25.2 g of TFMB were dissolved in a solvent DMAc under stirring in a 200-ml separable flask in a nitrogen gas stream. Then, 14.5 g of PMDA and 5.2 g of 6FDA were added to the solution. Then, the solution was continuously stirred at room temperature for 5 hours so as to be subjected to a polymerization reaction, and the resultant was kept for a whole day and night. A viscous polyamide acid solution was obtained, and it was confirmed that polyamide acid A having a high polymerization degree was generated.

The polyamide acid solution was applied onto a copper foil (electrolytic copper foil "DFF" manufactured by Mitsui Mining & Smelting Co., Ltd.) having a thickness of 18 µm with an applicator so that the film thickness after heat treatment became about 25 µm, and the resultant was increased in temperature from 90° C. to 360° C. at a rate of 22° C. per minute in a nitrogen oven so as to obtain a laminate of the copper foil and the polyimide. The laminate was immersed in a ferric chloride etchant so as to remove the copper foil, to thereby obtain film-shaped polyimide A. Table 2 shows the results obtained by conducting various evaluations of the film-shaped polyimide A thus obtained. Further, the curled state of the laminate including a gas barrier layer obtained by forming a silicon oxide film on the polyimide film A was observed, and as a result, no curling was found in the size measuring 10 cm per side. On the other hand, slight curling was found in the site measuring 100 cm per side.

Example 2

Polyimide B 25.7 g of TFMB serving as a diamine, 15.7 g of PMDA serving as an acid anhydride, and 3.6 g of 6FDA ware added by having stirred in a 200-ml separable flash in a nitrogen gas stream. Then, the solution was continuously stirred at room temperature for 5 hours so as to be subjected to a polymerization reaction, and the resultant was kept for a whole day and night. A viscous polyamide acid solution was obtained, and it was confirmed that polyamide acid B having a high polymerization degree was generated.

Film-shaped polyimide B was obtained in the same way as in Example 1 through use of the polyamide acid solution thus obtained.

Example 3

Polyimide C 26.3 g of TFMB were dissolved in a solvent DMAc under stirring in a 200-ml separable flask in a nitrogen gas stream. Then, 16.9 g of PMDA and 1.8 g of 6FDA were added to the solution. Then, the stirred was continuously stirred at room temperature for 5 hours so as to be subjected to a polymerization reaction, and the resultant was kept for a whole day and night. A viscous polyamide acid solution was obtained, and it was confirmed that polyamide acid C having a high polymerization degree was generated.

The polyamide acid solution was applied onto a copper foil (electrolytic copper foil "DFF" manufactured by Mitsui Mining & Smelting Co., Ltd.) having a thickness of 18 µm with an applicator so that the film thickness after heat treatment became about 25 µm, and the resultant was increased in temperature from 90° C. to 360° C. at a rate of 22° C. per minute in a hot air oven so as to obtain a laminate of the copper foil and the polyimide film. Next, a pressure-sensitive adhesive film (PET film: 100 µm, pressure-sensitive adhesive: 33 µm) was bonded onto a surface of the polyimide film. After that, the laminate was immersed in a ferric chloride etchant so as to remove the copper foil. Further, the polyimide film was separated from the pressure-sensitive adhesive film so as to obtain film-shaped polyimide C.

Comparative Example 1

Polyimide D

Film-shaped polyimide D was obtained in the same way as in Example 1 except for using 23.4 g of TFMB serving as a diamine, 10.3 g of PMDA serving as an acid anhydride, and 11.3 g of 6FDA.

Comparative Example 2

Polyimide E

Film-shaped polyimide E was obtained in the same way as in Example 1 except for using 23.0 g of TFMB serving as a diamine, 9.3 g of PMDA serving as an acid anhydride, and 12.7 g of 6FDA.

Comparative Example 3

Polyimide F

Film-shaped polyimide F was obtained in the same way as in Example 1 except for using 23.5 g of TFMB serving as a diamine and 21.5 g of BPDA serving as an acid anhydride.

Example 4

18.9 g of TFMB were dissolved in a solvent DMAc under stirring in a 200-ml separable flask in a nitrogen gas stream. Next, 26.1 g of 6FDA were added to the solution. Then, the solution was continuously stirred at room temperature for 5 hours so as to be subjected to a polymerization reaction, and the resultant was kept for a whole day and night. A viscous polyamide acid solution G was obtained, and it was confirmed that polyamide acid having a high polymerization degree was generated.

Next, the polyamide acid solution C obtained in Example 3 was applied onto a rolled copper foil having a thickness of 18 μm with an applicator so that the film thickness after heat treatment became about 25 μm, and the resultant was heated at a temperature of from 90° C. to 130° C. for from 1 minute to 5 minutes in a hot air oven. Then, the polyamide acid solution G was further applied onto the laminate of the polyamide acid and the copper foil thus obtained so that the thickness became 5 μm, and the resultant was increased in temperature from 90° C. to 360° C. at a rate of 22° C. per minute in a hot air oven so as to obtain a laminate of the copper foil and two layers of the polyimide.

Next, the laminate was immersed in a ferric chloride etchant so as to remove the copper foil, to thereby obtain a polyimide laminate film formed of the polyimide C and polyimide G. Separately, a single layer film of the polyimide G was prepared by the same procedure and measured for a modulus of elasticity to be 4.5 GPa.

Example 5

The polyamide acid solution C was applied onto glass having a thickness of 0.5 mm with an applicator so that the film thickness after heat treatment became about 28 μm, and the resultant was dried by heating at 130° C. in a hot air oven so as to remove the solvent in the resin solution. Then, the resultant was heated at 150° C., 200° C. and 250° C. for 30 minutes and heated at 360° C. for 1 minute so as to obtain a laminate of the glass and the polyimide film. Next, a pressure-sensitive adhesive film (PET film: 100 μm, pressure-sensitive adhesive: 33 μm) was bonded onto a surface of the polyimide film, and the polyimide film was peeled from the glass. Then, the polyimide film was separated from the pressure-sensitive adhesive film so as to obtain film-shaped polyimide C.

Example 6

Film-shaped polyimide C was obtained in the same way as in Example 5 except for setting the heating time at 360° C. to 30 minutes.

Example 7

Film-shaped polyimide C was obtained in the same way as in Example 5 except for performing the heat treatment in a nitrogen oven.

Example 8

Film-shaped polyimide C was obtained in the same way as in Example 5 except for setting the thickness of the glass to 3 mm.

Example 9

Film-shaped polyimide C was obtained in the same way as in Example 5 except for performing the application so that the film thickness after the heat treatment became about 11 μm.

Example 10

Film-shaped polyimide C was obtained in the same way as in Example 9 except for performing the heat treatment in a nitrogen oven.

Example 11

19.2 g of TFMB were dissolved in a solvent DMAc under stirring in a 200-ml separable flask in a nitrogen gas stream. Then, 13.1 g of PMDA were added to the solution. Then, the solution was continuously stirred at room temperature for 5 hours so as to be subjected to a polymerization reaction, and the resultant was kept for a whole day and night. A viscous polyamide acid solution was obtained, and it was confirmed that polyamide acid H having a high polymerization degree was generated.

Film-shaped polyimide H was obtained in the same way as in Example 5 except for using the polyamide acid solution H.

Example 12

The polyamide acid solution was applied onto a copper foil (electrolytic copper foil "DFF" manufactured by Mitsui Mining & Smelting Co., Ltd.) having a thickness of 18 μm with an applicator so that the film thickness after heat treatment became about 20 μm, and the resultant was increased in temperature from 90° C. to 360° C. at a rate of 22° C. per minute in a nitrogen oven so as to obtain a laminate of the copper foil and the polyimide. The laminate was immersed in a ferric chloride etchant without forming a stress relaxation layer so as to remove the copper foil, to thereby obtain film-shaped polyimide A.

Example 13

Film-shaped polyimide C was obtained in the same way as in Example 7 except for peeling the polyimide film from the glass without using the pressure-sensitive adhesive film.

Example 14

The polyamide acid solution C was applied onto glass having a thickness of 0.5 mm with an applicator so that the film thickness after heat treatment became about 11 µm, and the resultant was dried by heating at 130° C. in a nitrogen oven so as to remove the solvent in the resin solution, to thereby obtain a laminate of the glass and the gel film. Next, the gel film was peeled from the glass and fixed to a tenter clip. The gel film was heated at 150° C., 200° C., and 250° C. for 30 minutes, and heated at 360° C. for 1 minute so as to obtain polyimide C.

Comparative Example 4

Film-shaped polyimide G was obtained in the same way as in Example 13 except for using the polyamide acid solution G.

Comparative Example 5

A commercially available transparent polyimide film (Neopulim L manufactured by Mitsubishi Gas Chemical Company, Inc., thickness: 100 µm) (hereinafter referred to as "polyimide I") was measured in the same way. Both surfaces of the film were observed for surface scratches.

Further, a silicon nitride film having a thickness of 50 nm was formed by CVD on each of the polyimide films A to I and the polyimide laminate film of the polyimide films C and G, and the occurrence of cracks was observed with a microscope. As a result, no cracks were observed in the laminate of C/G, and slight cracks were observed in the polyimide films A, B, C, and H. Further, a large number of cracks were observed in the polyimide films D, E, F, G, and I.

Table 2 shows characteristics values of the polyimide films A to I and the polyimide laminate film (C/G film) of the polyimide films C and G thus obtained. As shown in Table 2, as is apparent from the results obtained from Examples 1 to 14 and Comparative Examples 1 to 5, the polyimides satisfying the conditions of the present invention were also excellent in transparency and had a low coefficient of thermal expansion without any warping, and the surface roughness and the value of retardation of the surface of each polyimide resin layer were low. Further, curling was hardly confirmed when the gas barrier layer was formed, and the evaluation on the occurrence of the cracks was also satisfactory. On the other hand, the films formed of the polyimide resin layers not satisfying the conditions of the present invention had a large coefficient of thermal expansion, and curling was confirmed when the gas barrier layer was formed. Further, a large number of cracks occurred.

TABLE 2

| | | Acid anhydride | | | Diamine | High-temperature heat treatment | Stress | | 400-nm |
|---|---|---|---|---|---|---|---|---|---|
| | Polyimide | PMDA mol % | 6PDA mol % | BPDA mol % | TFMB mol % | time min | relaxation layer | Transmittance % | transmittance % |
| Example 1 | A | 85 | 15 | 0 | 100 | 0.9 | — | 83.4 | 15.7 |
| Example 2 | B | 90 | 10 | 0 | 100 | 0.9 | — | 82.9 | 14.1 |
| Example 3 | C | 95 | 5 | 0 | 100 | 0.9 | — | 80.5 | 12.5 |
| Example 4 | C/G | | | | | 0.9 | — | 80.5 | 12.1 |
| Example 5 | C | 95 | 5 | 0 | 100 | 1.0 | Present | 85.1 | 11.4 |
| Example 6 | C | 95 | 5 | 0 | 100 | 30 | Present | 80.1 | 6.4 |
| Example 7 | C | 95 | 5 | 0 | 100 | 1.0 | Present | 86.1 | 13.4 |
| Example 8 | C | 95 | 5 | 0 | 100 | 1.0 | Present | 35.0 | 11.4 |
| Example 9 | C | 95 | 5 | 0 | 100 | 1.0 | Present | 86.5 | 32.0 |
| Example 10 | C | 95 | 5 | 0 | 100 | 1.0 | Present | 87.5 | 34.0 |
| Example 11 | H | 100 | 0 | 0 | 100 | 1.0 | Present | 82.1 | 20.0 |
| Example 12 | A | 85 | 15 | 0 | 100 | 1.0 | Absent | 83.4 | 15.7 |
| Example 13 | C | 95 | 5 | 0 | 100 | 1.0 | Absent | 85.1 | 11.4 |
| Example 14 | C | 95 | 5 | 0 | 100 | 1.0 | Absent | 87.6 | 24.2 |
| Comparative Example 1 | D | 65 | 35 | 0 | 100 | 0.9 | — | 85.4 | 24.9 |
| Comparative Example 2 | E | 60 | 40 | 0 | 100 | 0.9 | — | 86.1 | 27.8 |
| Comparative Example 3 | F | 0 | 0 | 100 | 100 | 0.9 | — | 76.1 | 6.1 |
| Comparative Example 4 | G | 0 | 100 | 0 | 100 | 1.0 | Absent | 89.8 | 80.6 |
| Comparative Example 5 | I | | | | | | | 89.5 | 83.9 |

| | Coefficient of thermal expansion ppm/K | Thermal weight loss % | Retardation nm | Surface roughness nm | Surface scratch | Coefficient of humidity expansion ppm/% RH | Crack |
|---|---|---|---|---|---|---|---|
| Example 1 | 9.8 | 1.3 | 8 | 3.2 | — | 4.8 | ○ |
| Example 2 | 6.9 | 1.3 | 8 | 4.0 | — | 4.0 | ○ |
| Example 3 | 3.8 | 1.4 | 5 | 4.0 | — | 3.5 | ○ |
| Example 4 | 9.6 | 1.3 | 4 | 4.0 | — | 3.8 | none |
| Example 5 | 7.1 | 1.2 | 4 | 2.0 | ○ | 3.6 | ○ |

TABLE 2-continued

| | | | | | | | |
|---|---|---|---|---|---|---|---|
| Example 6 | 6.2 | 1.2 | 4 | 1.8 | ○ | 3.4 | ○ |
| Example 7 | 7.1 | 1.2 | 9 | 1.5 | ○ | 3.3 | ○ |
| Example 8 | 5.0 | 1.2 | 8 | 2.0 | ○ | 3.4 | ○ |
| Example 9 | 1.2 | 1.3 | 4 | 2.0 | ○ | 3.5 | ○ |
| Example 10 | 1.2 | 1.3 | 9 | 2.0 | ○ | 3.5 | ○ |
| Example 11 | −1.8 | 0.8 | 5 | 1.2 | ○ | 3.2 | ○ |
| Example 12 | 9.6 | 1.3 | 11 | 2.8 | x | 4.8 | ○ |
| Example 13 | 7.1 | 1.2 | 15 | 3.7 | Δ | 3.6 | ○ |
| Example 14 | −0.3 | 1.3 | 32 | 2.0 | Δ | 3.5 | ○ |
| Comparative Example 1 | 16.3 | 1.1 | 3 | 3.8 | — | 4.9 | x |
| Comparative Example 2 | 20.4 | 1.3 | 3 | 3.7 | — | 5.0 | x |
| Comparative Example 3 | 63.7 | 1.1 | 3 | 4.8 | — | 6.4 | x |
| Comparative Example 4 | 65.7 | — | 1 | — | Δ | — | x |
| Comparative Example 5 | 52.0 | — | 47 | — | x | — | x |

While the present invention has been described by way of Examples, the configurations described in Examples are merely illustrative, and modifications can be appropriately made without departing from the technical concept of the present invention.

REFERENCE SIGNS LIST 1 supporting base
2 sealing substrate
3-1, 3-2, 3-3 gas barrier layer
4 thin film transistor
5 circuit-forming layer including thin film transistor
6 anode electrode
7 light-emitting layer
8 cathode electrode
9 adhesive layer
LT light to be extracted to outside

The invention claimed is:

1. A manufacturing method for a display device, the manufacturing method comprising:
applying a resin solution of polyimide or a polyimide precursor onto a base substrate so that a thickness of a polyimide film becomes 50 μm or less;
forming the polyimide film on the base substrate by completing heat treatment;
forming a stress relaxation layer for preventing stretching of the polyimide film on the polyimide film;
removing the base substrate under a state in which the polyimide film and the stress relaxation layer are laminated; and
forming a member for a display device,
wherein the polyimide film comprises a single polyimide layer or a plurality of polyimide layers and has a retardation in an in-plane direction of 10 nm or less.

2. A manufacturing method for a display device according to claim 1, wherein a bottom surface of the polyimide film is irradiated with laser light through the base substrate so that the polyimide film and the base substrate are peeled from each other.

3. A display device obtained by using the method according to claim 1.

4. A production method for a polyimide film for a display device supporting base,
the production method comprising:
applying a resin solution of polyimide or a polyimide precursor onto a base substrate so that a thickness of a polyimide film becomes 50 μm or less;
forming the polyimide film on the base substrate by completing heat treatment; and
peeling the polyimide film from the base substrate,
wherein the polyimide film has a transmittance of 80% or more in a wavelength region of from 440 nm to 780 nm and a transmittance of 80% or less at 400 nm, and
wherein a bottom surface of the polyimide film is irradiated with laser light through the base substrate so that the polyimide film and the base substrate are peeled from each other.

5. A production method for a polyimide film for a display device supporting base according to claim 4, wherein the base substrate comprises glass.

6. A production method for a polyimide film for a display device supporting base,
the production method comprising:
applying a resin solution of polyimide or a polyimide precursor onto a base substrate so that a thickness of a polyimide film becomes 50 μm or less;
forming the polyimide film on the base substrate by completing heat treatment; and
peeling the polyimide film from the base substrate,
wherein the base substrate is removed under a state which the polyimide film is fixed to another substrate, and the polyimide film and the base are peeled from each other.

* * * * *